United States Patent
Takeda et al.

(10) Patent No.: US 9,219,349 B2
(45) Date of Patent: Dec. 22, 2015

(54) SURFACE EMITTING SEMICONDUCTOR LASER, SURFACE EMITTING SEMICONDUCTOR LASER DEVICE, OPTICAL TRANSMISSION DEVICE, AND INFORMATION PROCESSING APPARATUS

(71) Applicant: FUJI XEROX CO., LTD., Minato-ku, Tokyo (JP)

(72) Inventors: Kazutaka Takeda, Kanagawa (JP); Takashi Kondo, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 200 days.

(21) Appl. No.: 13/887,909

(22) Filed: May 6, 2013

(65) Prior Publication Data

US 2014/0023380 A1    Jan. 23, 2014

(30) Foreign Application Priority Data

Jul. 23, 2012   (JP) .................................. 2012-162279

(51) Int. Cl.

| | |
|---|---|
| *H01S 5/30* | (2006.01) |
| *H04B 10/50* | (2013.01) |
| *H01S 5/183* | (2006.01) |
| *H01S 5/343* | (2006.01) |
| H01S 5/022 | (2006.01) |
| H01S 5/065 | (2006.01) |
| H01S 5/20 | (2006.01) |

(52) U.S. Cl.
CPC .............. *H01S 5/30* (2013.01); *H01S 5/18313* (2013.01); *H01S 5/18358* (2013.01); *H01S 5/3432* (2013.01); *H04B 10/503* (2013.01); H01S 5/02284 (2013.01); H01S 5/02288 (2013.01); H01S 5/0654 (2013.01); H01S 5/2009 (2013.01); H01S 2301/163 (2013.01)

(58) Field of Classification Search
CPC .............. H01S 5/0653; H01S 5/18311; H01S 5/18322; H01S 5/18358; H01S 2301/163; H01S 5/0654; H01S 5/183
See application file for complete search history.

(56) References Cited

U.S. PATENT DOCUMENTS 4,573,156 A * 2/1986 Anthony et al. ................. 372/19
7,830,944 B2 * 11/2010 Takeuchi et al. ................ 372/99

(Continued)

FOREIGN PATENT DOCUMENTS

| | | |
|---|---|---|
| JP | 2002-353561 A | 12/2002 |
| JP | 2005-129960 A | 5/2005 |
| JP | 2009-152553 A | 7/2009 |

*Primary Examiner* — Yuanda Zhang
*Assistant Examiner* — Michael Carter
(74) *Attorney, Agent, or Firm* — Sughrue Mion, PLLC

(57) ABSTRACT

A surface emitting semiconductor laser includes: a substrate; a first semiconductor multilayer reflector on the substrate including laminated pairs of a high refractive index layer relatively high in refractive index and a low refractive index layer relatively low in refractive index; an active region on or above the first reflector; a second semiconductor multilayer reflector on or above the active region including laminated pairs of a high refractive index layer relatively high in refractive index and a low refractive index layer relatively low in refractive index; and a cavity extending region formed between the first reflector and the active region or between the second reflector and the active region, having an optical film thickness greater than an oscillation wavelength, extending a cavity length, including a conductive semiconductor material, and including an optical loss causing layer at at least one node of a standing wave of a selected longitudinal mode.

14 Claims, 6 Drawing Sheets

(56) References Cited

U.S. PATENT DOCUMENTS

2008/0095202 A1* 4/2008 Yanagisawa et al. ........... 372/19
2010/0008393 A1* 1/2010 Enya et al. ................. 372/46.01
2011/0170568 A1* 7/2011 Kondo ....................... 372/45.01

* cited by examiner

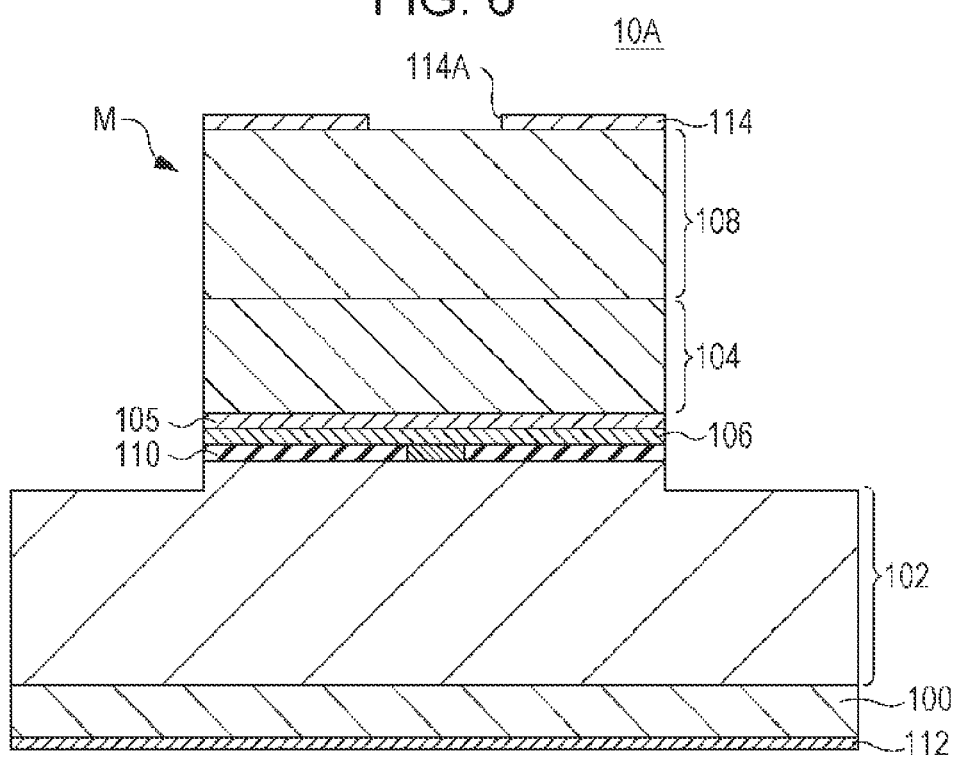
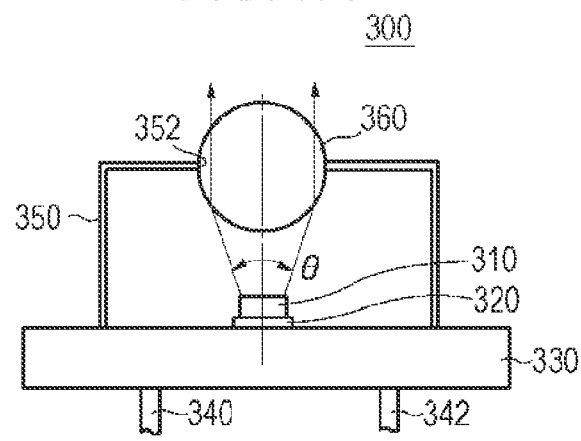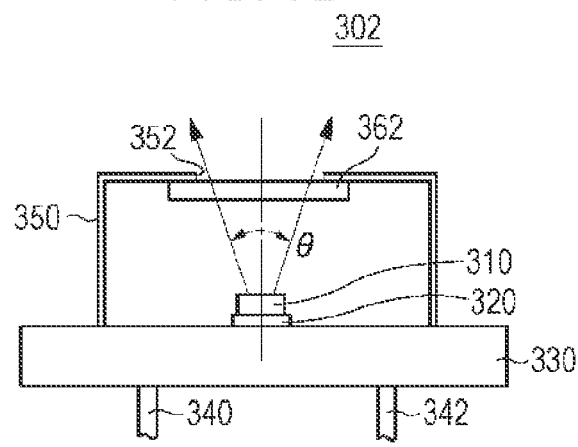

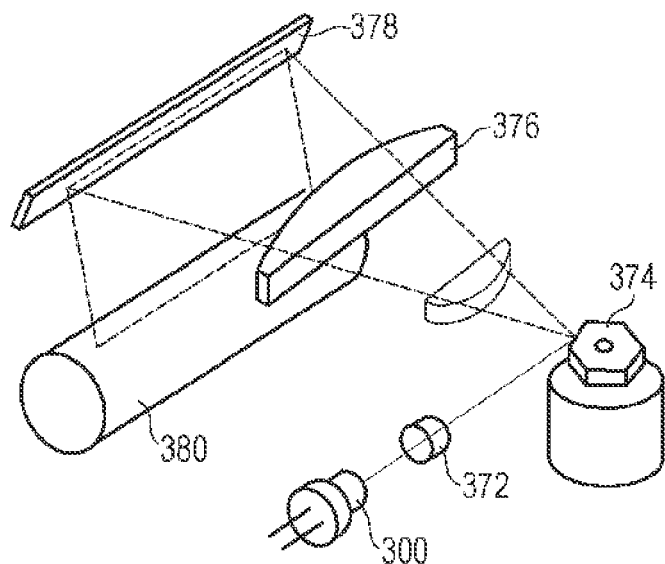
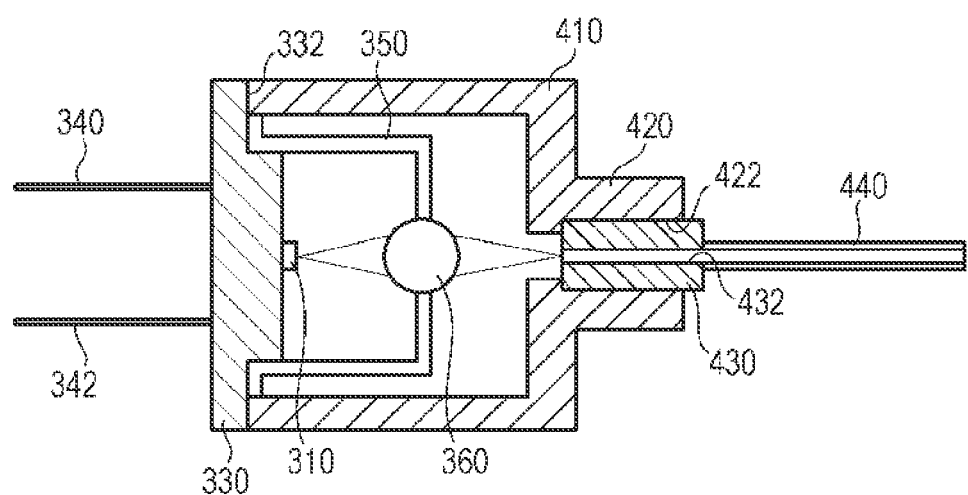

SURFACE EMITTING SEMICONDUCTOR LASER, SURFACE EMITTING SEMICONDUCTOR LASER DEVICE, OPTICAL TRANSMISSION DEVICE, AND INFORMATION PROCESSING APPARATUS

CROSS-REFERENCE TO RELATED APPLICATIONS

This application is based on and claims priority under 35 USC 119 from Japanese Patent Application No. 2012-162279 filed Jul. 23, 2012.

BACKGROUND

Technical Field

The present invention relates to a surface emitting semiconductor laser, a surface emitting semiconductor laser device, an optical transmission device, and an information processing apparatus.

A surface emitting semiconductor laser is a light emitting element that emits laser light in a direction perpendicular to a substrate. Therefore, the surface emitting semiconductor laser is easily configured as a two-dimensional array, and has been put to practical use in light sources for printers, image forming apparatuses, optical communication, and so forth. Further, to stably operate the surface emitting semiconductor laser in a single transverse mode and a single longitudinal mode, studies have been made to cause a difference in loss between a fundamental transverse mode and a high-order transverse mode.

SUMMARY

According to an aspect of the invention, there is provided a surface emitting semiconductor laser including a substrate, a first semiconductor multilayer reflector, an active region, a second semiconductor multilayer reflector, and a cavity extending region. The first semiconductor multilayer reflector is formed on the substrate, and includes laminated pairs of a high refractive index layer having a relatively high refractive index and a low refractive index layer having a relatively low refractive index. The active region is formed on or above the first semiconductor multilayer reflector. The second semiconductor multilayer reflector is formed on or above the active region, and includes laminated pairs of a high refractive index layer having a relatively high refractive index and a low refractive index layer having a relatively low refractive index. The cavity extending region is formed between the first semiconductor multilayer reflector and the active region or between the second semiconductor multilayer reflector and the active region, has an optical film thickness greater than an oscillation wavelength, extends a cavity length, and includes a conductive semiconductor material. The cavity extending region includes an optical loss causing layer at the position of at least one node of a standing wave of a selected longitudinal mode.

BRIEF DESCRIPTION OF THE DRAWINGS

Exemplary embodiments of the present invention will be described in detail based on the following figures, wherein:

FIG. 6 is a schematic cross-sectional view of a surface emitting semiconductor laser having an extended cavity structure according to a third exemplary embodiment of the invention;

FIGS. 7A and 7B are schematic cross-sectional views each illustrating the configuration of a surface emitting semiconductor laser device mounted with the surface emitting semiconductor laser according to one of the exemplary embodiments and an optical member;

FIG. 8 is a diagram illustrating a configuration example of a light source device using the surface emitting semiconductor laser according to one of the exemplary embodiments; and FIG. 9 is a schematic cross-sectional view illustrating the configuration of an optical transmission device using the surface emitting semiconductor laser device illustrated in FIG. 7A.

DETAILED DESCRIPTION

Exemplary embodiments of the present invention will now be described with reference to the drawings. A surface emitting semiconductor laser (vertical cavity surface emitting laser, which will hereinafter be referred to as the VCSEL) is used in light sources of communication devices and image forming apparatuses. For an increase in processing speed of printers and so forth, there is and will be a demand for a single-mode, high-power VCSEL. To obtain a single mode (fundamental transverse mode) with a related-art oxide confinement structure, it is necessary to set the diameter of an oxide aperture to 2 to 3 μm. With the oxide aperture diameter of this size, however, it is difficult to stably obtain a single-mode output of 3 mW or more. An increase in oxide aperture diameter may realize higher power, but causes multi-mode (high-order transverse mode) oscillation. Therefore, a VCSEL having an extended cavity structure is expected to serve as a technique of realizing higher optical power while maintaining the single mode irrespective of the increase in oxide aperture diameter.

Figure 1A:
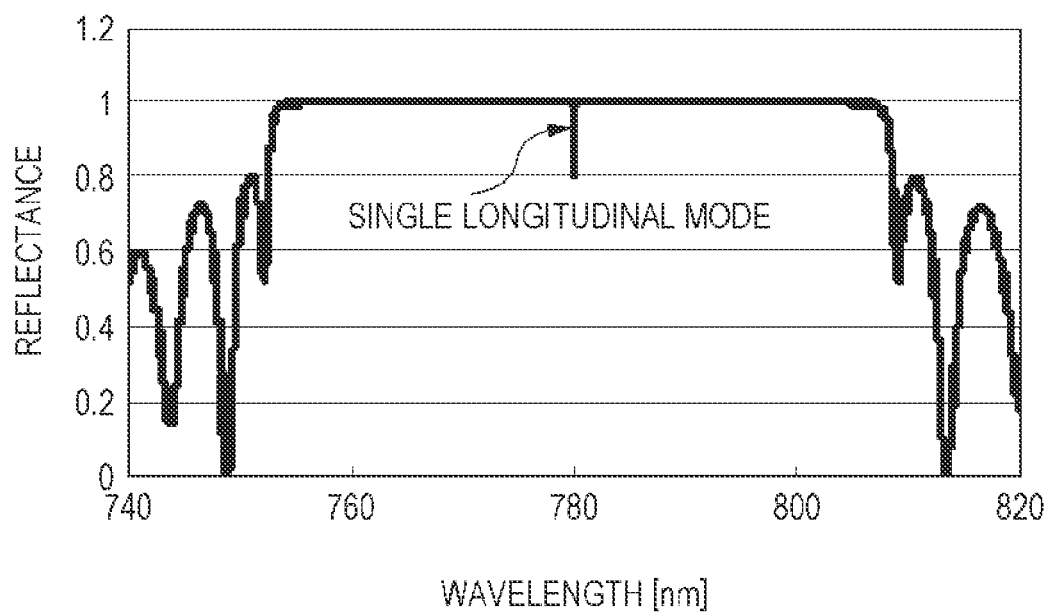
FIG. 1A is a graph for describing a single longitudinal mode of a surface emitting semiconductor laser having a λ cavity structure (the vertical axis represents the reflectance, and the horizontal axis represents the wavelength)
Figure 1B:
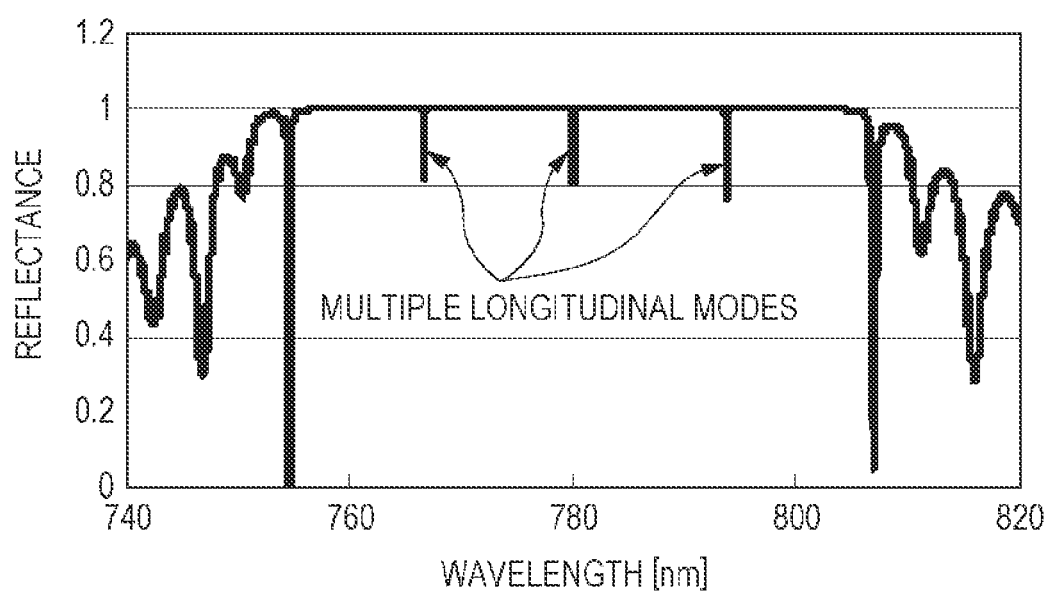
FIG. 1B is a graph illustrating multiple longitudinal modes of a surface emitting semiconductor laser having an extended cavity structure.

According to a VCSEL having an extended cavity structure, a spacer layer corresponding to a few times to dozen times the oscillation wavelength λ is inserted between a light emitting region and a semiconductor multilayer reflector (distributed Bragg reflector, which will hereinafter be referred to as the DBR) in a VCSEL having a common λ cavity structure to increase the cavity length and thereby increase the loss in the high-order transverse mode. Accordingly, single-mode oscillation is possible with an oxide aperture diameter greater than the oxide aperture diameter of the VCSEL having a common λ cavity structure. A VCSEL having a typical λ cavity structure has a large longitudinal mode interval (free spectral range), and thus is capable of stably operating in a single longitudinal mode, as illustrated in FIG. 1A. Meanwhile, in a VCSEL having an extended cavity structure, the increased cavity length narrows the longitudinal mode interval. As illustrated in FIG. 1B, therefore, multiple longitudinal modes (standing waves) are present in a resonator. As a result, switching between the longitudinal modes tends to occur. In the VCSEL having an extended cavity structure, therefore, it is demanded to suppress the switching between the longitudinal modes. The present invention relates to a VCSEL having an extended cavity structure, which suppresses such switching between the longitudinal modes.

In the following description, a selective oxidation-type VCSEL having an extended cavity structure will be described as an example. It should be noted that the scale of the drawings is emphasized for the purpose of clarifying features of exemplary embodiments of the invention, and is not necessarily the same as the scale of actual devices.

Exemplary Embodiments

Figure 2:
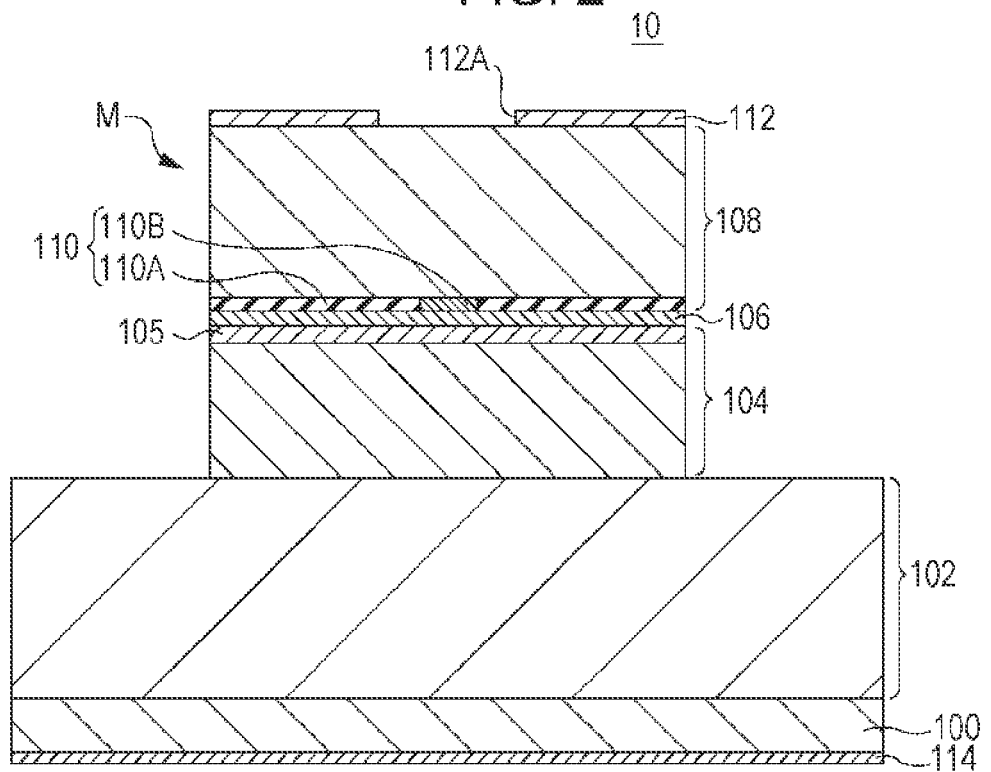
FIG. 2 is a schematic cross-sectional view of a surface emitting semiconductor laser having an extended cavity structure according to a first exemplary embodiment of the invention.

FIG. 2 is a schematic cross-sectional view of a VCSEL having an extended cavity structure according to an exemplary embodiment of the invention. As illustrated in the drawing, a VCSEL 10 of the present exemplary embodiment is configured such that an n-type lower DBR 102, a cavity extending region 104, an n-type carrier blocking layer 105, an active region 106, and a p-type upper DBR 108 are laminated on an n-type GaAs substrate 100. The n-type lower DBR 102 includes alternately laminated AlGaAs layers of different Al compositions. The cavity extending region 104 is formed on the lower DBR 102, and extends the cavity length. The n-type carrier blocking layer 105 is formed on the cavity extending region 104. The active region 106 is formed on the carrier blocking layer 105, and includes a quantum well layer sandwiched by upper and lower spacer layers. The p-type upper DBR 108 is formed on the active region 106, and includes alternately laminated AlGaAs layers of different Al compositions.

The n-type lower DBR 102 is a multilayer laminate of pairs of an $Al_{0.9}Ga_{0.1}As$ layer and an $Al_{0.3}Ga_{0.7}As$ layer. The layers each have a thickness of $\lambda/4 n_r$ (wherein $\lambda$ represents the oscillation wavelength, and $n_r$ represents the refractive index of a medium), and are alternately laminated by 40 periods. The carrier concentration of the n-type lower DBR 102 after doping with silicon as an n-type impurity is $3\times10^{18}$ $cm^{-3}$, for example.

The cavity extending region 104 is a monolithic layer formed by repeating epitaxial growth. Therefore, the cavity extending region 104 is made of a material that matches or is consistent with the GaAs substrate 100 in lattice constant, such as AlGaAs, GaAs, or AlAs. Herein, the cavity extending region 104 is made of AlGaAs not causing light absorption to emit laser light in a 780 nm band. The cavity extending region 104 has a film thickness corresponding to a few times to dozen times the oscillation wavelength $\lambda$, and increases the moving distance of carrier. It is therefore desirable that the cavity extending region 104 is of the n-type having high carrier mobility. For this reason, the cavity extending region 104 is inserted between the n-type lower DBR 102 and the active region 106. For example, the cavity extending region 104 has a film thickness of approximately 3 to 4 microns or an optical film thickness of approximately $16\lambda$. Such a cavity extending region 104 may also be referred to as a cavity extending region or a cavity space.

Desirably, the carrier blocking layer 105 made of $Al_{0.9}Ga_{0.1}As$, for example, and having a wide band gap is formed between the cavity extending region 104 and the active region 106. With the insertion of the carrier blocking layer 105, a carrier leakage from the active region 106 is prevented, and the light emission efficiency is improved. As described later, optical loss causing layers that attenuate the oscillation intensity of the laser light to some extent are inserted in the cavity extending region 104. Therefore, the carrier blocking layer 105 functions to compensate for such a loss. For example, the carrier blocking layer 105 has a film thickness of $\lambda/4$ $mn_r$ (wherein $\lambda$, m, and $n_r$ represent the oscillation wavelength, an integer, and the refractive index of the medium, respectively).

In the active region 106, the lower spacer layer is an undoped $Al_{0.6}Ga_{0.4}As$ layer, and the quantum well active layer is an undoped $Al_{0.11}Ga_{0.89}As$ quantum well layer and an undoped $Al_{0.3}Ga_{0.7}As$ barrier layer. Further, the upper spacer layer is an undoped $Al_{0.6}Ga_{0.4}As$ layer.

The p-type upper DBR 108 is a laminate of p-type $Al_{0.9}Ga_{0.1}As$ layers and p-type $Al_{0.4}Ga_{0.6}As$ layers. The layers each have a thickness of $\lambda/4 n_r$, and are alternately laminated by 29 periods. The carrier concentration of the p-type upper DBR 108 after doping with carbon as a p-type impurity is $3\times10^{18}$ $cm^{-3}$, for example. Desirably, a contact layer made of p-type GaAs is formed on the uppermost layer of the upper DBR 108, and a current confining layer 110 made of p-type AlAs is formed on the lowermost layer of the upper DBR 108 or inside the upper DBR 108.

Semiconductor layers from the upper DBR 108 to the lower DBR 102 are etched to form a cylindrical mesa (substantially columnar structure) M on the substrate 100, and the current confining layer 110 is exposed by the mesa M. The current confining layer 110 is formed with an oxidized region 110A selectively oxidized from a side surface of the mesa M and a conductive region (oxide aperture) 110B surrounded by the oxidized region 110A. In an oxidation process, the oxidation rate is higher in an AlAs layer than in an AlGaAs layer, and the oxidized region 110A is oxidized inwardly from the side surface of the mesa M at a substantially constant speed. Therefore, a planar shape of the conductive region 110B parallel to the substrate 100 has a shape reflecting the outer shape of the mesa M, i.e., a circular shape, and the center thereof substantially matches the optical axis in the axial direction of the mesa M. In the VCSEL 10 having an extended cavity structure, it is possible to set the diameter of the conductive region 110B for obtaining the fundamental transverse mode to be greater than in a VCSEL having a common $\lambda$ cavity structure. For example, it is possible to increase the diameter of the conductive region 110B up to approximately 7 to 8 microns. Accordingly, it is possible to realize higher optical power.

The uppermost layer of the mesa M is formed with a ring-shaped p-side electrode 112 made of metal such as a laminate of Ti/Au. The p-side electrode 112 is ohmically connected to the contact layer of the upper DBR 108. The p-side electrode 112 is formed with a circular light emission window 112A, the center of which matches the optical axis of the mesa M, and laser light is emitted outside through the window 112A. Further, a rear surface of the substrate 100 is formed with an n-side electrode 114.

Figure 3:
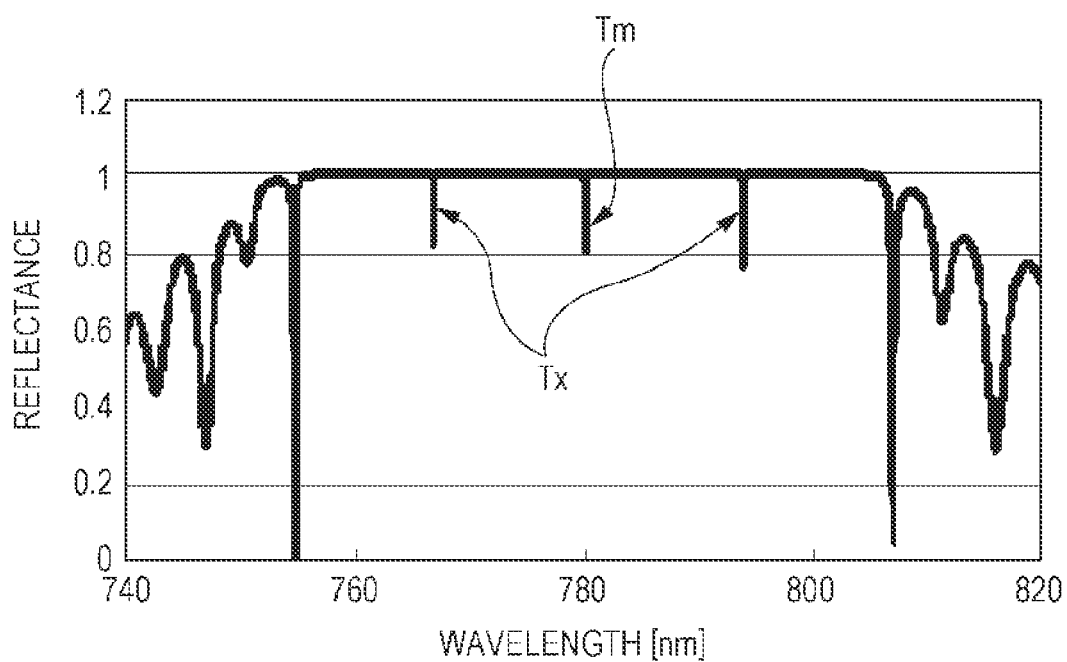
FIG. 3 is a graph for describing the suppression of switching between longitudinal modes in a surface emitting semiconductor laser having an extended cavity structure.

As described above, in a VCSEL having an extended cavity structure, multiple longitudinal modes are present in a reflection band determined by the cavity length. Therefore, it is necessary to suppress switching or hopping between the longitudinal modes. FIG. 3 illustrates an example of multiple longitudinal modes generated in a VCSEL having an extended cavity structure (the vertical axis represents the reflectance, and the horizontal axis represents the wavelength). Herein, a necessary longitudinal mode Tm corresponds to an oscillation wavelength range of 780 nm, and the other longitudinal modes corresponding to oscillation wavelength ranges of 765 nm and 795 nm are unnecessary longitudinal modes Tx. In the present exemplary embodiment, therefore, layers causing optical loss in the standing waves of the unnecessary longitudinal modes Tx are provided in the cavity extending region 104 to suppress switching to the unnecessary longitudinal modes Tx.

Figure 4:
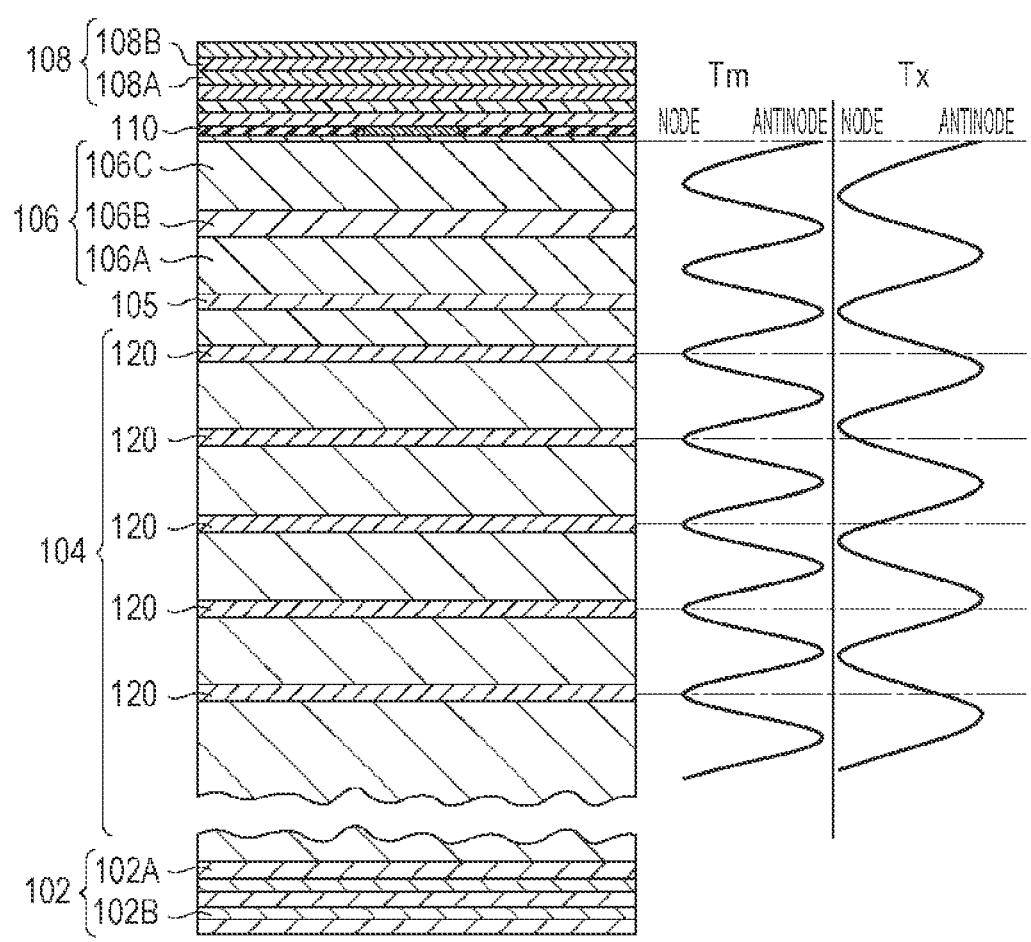
FIG. 4 is a cross-sectional view illustrating details of a cavity extending region of the surface emitting semiconductor laser illustrated in FIG. 2.

FIG. 4 is a cross-sectional view illustrating a detailed configuration of the cavity extending region 104 of the VCSEL 10 according to the present exemplary embodiment. As illustrated in the drawing, the lower DBR 102 is configured to include a laminate of pairs of a high refractive index layer 102A having a relatively low Al composition and a low refractive index layer 102B having a relatively high Al composition. The cavity extending region 104, the carrier blocking layer 105, and the active region 106 are sequentially formed on the lower DBR 102. A lower spacer layer 106A of the active region 106 is adjacent to the carrier blocking layer 105, and a multiple quantum well layer 106B is formed between the lower spacer layer 106A and an upper spacer layer 106C. The current confining layer 110 is formed adjacent to the active region 106. Further, the upper DBR 108 is formed which includes high refractive index layers 108A having a relatively low Al composition and low refractive index layers 108B having a relatively high Al composition.

In the cavity extending region 104 of the present exemplary embodiment, a layer 120 is inserted in each of the positions of nodes of the standing wave of the necessary longitudinal mode Tm to cause optical loss in the unnecessary longitudinal mode Tx. The optical loss causing layer 120 is made of a semiconductor material having the same Al composition as that of a semiconductor layer forming the cavity extending region 104. For example, the optical loss causing layer 120 is made of $Al_{0.3}Ga_{0.7}As$. Desirably, the optical loss causing layer 120 is higher in impurity doping concentration than the semiconductor layer forming the cavity extending region 104. For example, when the impurity concentration of AlGaAs forming the cavity extending region 104 is $1 \times 10^{17}$ $cm^{-3}$, the optical loss causing layer 120 is configured to have an impurity concentration of $1 \times 10^{18}$ $cm^{-3}$ higher than the impurity concentration of the other semiconductor layer by approximately one digit. An increase in impurity concentration increases the light absorption by the carrier, and causes a loss. The film thickness of the optical loss causing layer 120 is selected not to increase the loss in the necessary longitudinal mode Tm, and is desirably similar to the film thickness of the current confining layer 110 located at an antinode of the standing wave (approximately 10 to 30 nm).

The optical loss causing layer 120 is inserted to be located at a node of the standing wave of the necessary longitudinal mode Tm. The standing wave has low intensity at the nodes thereof. Therefore, the influence of the loss caused in the necessary longitudinal mode Tm by the optical loss causing layer 120 is small. Meanwhile, in the standing wave of the unnecessary longitudinal mode Tx, the optical loss causing layer 120 is located at an antinode other than the node. The intensity of the standing wave is higher at the antinode than at the node. Therefore, the loss caused in the unnecessary longitudinal mode Tx by the optical loss causing layer 120 is increased. In this manner, the loss in the unnecessary longitudinal mode Tx is increased, while the loss in the necessary longitudinal mode Tm is reduced. Thereby, resonance in the unnecessary longitudinal mode Tx is selectively prevented, and longitudinal mode hopping is suppressed.

When the wavelength of the necessary longitudinal mode Tm and the refractive index are represented as $\lambda 1$ and n, respectively, the position of a node of the standing wave is represented as $\lambda 1/(4 \cdot n)$. For example, when $\lambda 1$ and n are 780 nm and 3.1, respectively, the nodes of the standing wave are located at intervals of approximately 56 nm. As described above, it is desirable that the film thickness of the optical loss causing layer 120 is approximately 10 to 30 nm similar to that of the current confining layer 110. If the film thickness is excessively increased, however, the loss is increased in portions off the nodes of the necessary longitudinal mode Tm. It is therefore desirable that the upper limit of the film thickness of the optical loss causing layer 120 is $\lambda 1/4$ n or less or approximately $\lambda 1/4$ n or less, which corresponds to a half or less of the optical intensity distribution of the standing wave.

Further, in the example illustrated in FIG. 4, the multiple optical loss causing layers 120 are formed at the respective positions of the nodes of the standing wave of the necessary longitudinal mode Tm in the cavity extending region 104. The optical loss causing layer 120, however, is not necessarily required to be provided in plurality, and may be a single layer. The intensity of the standing wave is increased toward the active region 106. In this case, therefore, the optical loss causing layer 120 may be formed at the position of a node near the active region 106.

Further, as an alternative to the above-described increase in impurity concentration by doping, the optical loss causing layer 120 may be made of a semiconductor material that absorbs light on the oscillation wavelength $\lambda$. For example, if the oscillation wavelength $\lambda$ corresponds to the 780 nm band, the optical loss causing layer 120 in the layer forming the cavity extending region 104 may be made of GaAs that absorbs light on the oscillation wavelength $\lambda$, and the layer other than the optical loss causing layer 120 may be made of AlGaAs. Also in this case, the insertion position and the film thickness of GaAs are selected such that the loss in the necessary longitudinal mode Tm is reduced, and that the loss in the unnecessary longitudinal mode Tx is increased.

Figure 5:
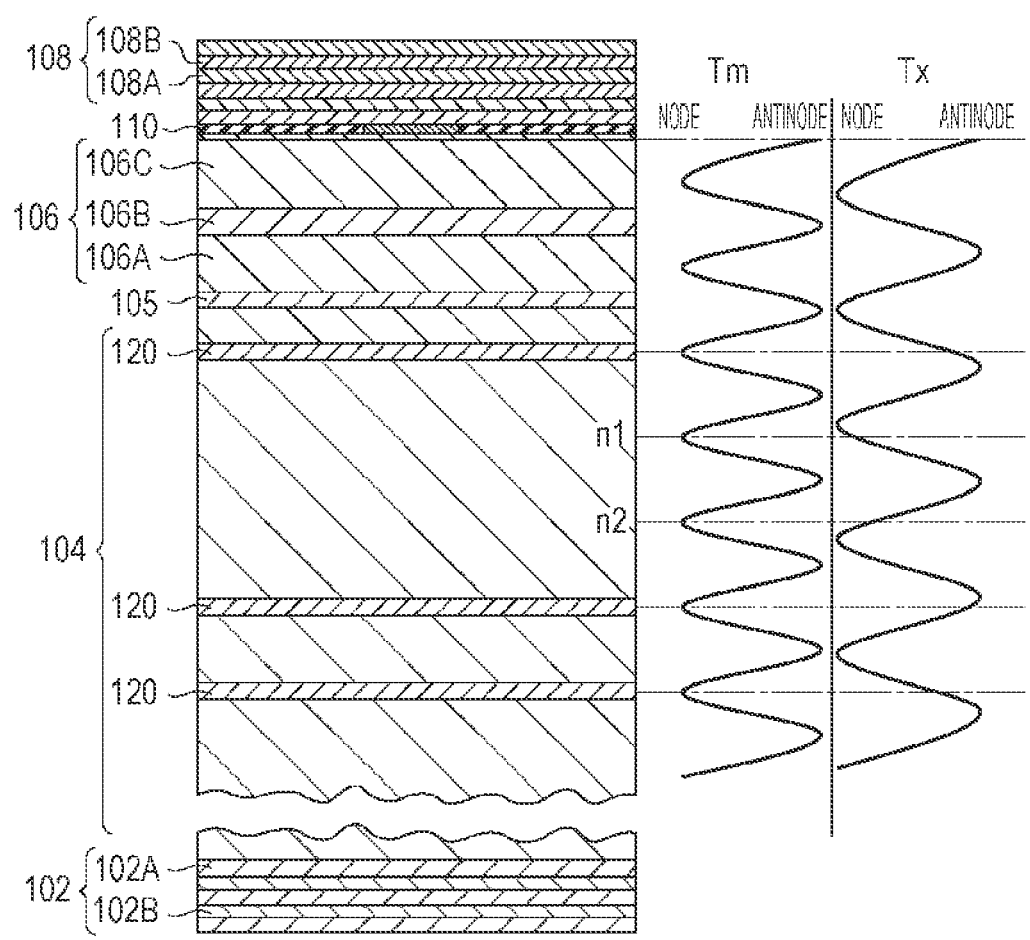
FIG. 5 is a cross-sectional view illustrating details of a cavity extending region of a surface emitting semiconductor laser having an extended cavity structure according to a second exemplary embodiment of the invention.

A second exemplary embodiment of the invention will now be described. FIG. 5 is a cross-sectional view illustrating details of a cavity extending region of a VCSEL having an extended cavity structure according to the second exemplary embodiment. In the second exemplary embodiment, the optical loss causing layer 120 is inserted in an antinode portion of the standing wave of the unnecessary longitudinal mode Tx, and is not inserted in a node portion. Even if the optical loss causing layer 120 is inserted in a node portion of the standing wave of the unnecessary longitudinal mode Tx, the resultant loss is small. Therefore, the optical loss causing layer 120 is inserted only in an antinode portion, in which the loss is increased. Accordingly, it is possible to minimize the influence of the loss in the standing wave of the necessary longitudinal mode Tm. In the example illustrated in FIG. 5, the optical loss causing layers located at nodes n1 and n2 of the unnecessary longitudinal mode Tx in the cavity extending region 104 illustrated in FIG. 4 are removed.

A third exemplary embodiment of the invention will now be described. FIG. 6 is a schematic cross-sectional view of a VCSEL 10A having an extended cavity structure according to the third exemplary embodiment. In the third exemplary embodiment, a p-type lower DBR 102 is formed on a p-type GaAs substrate 100. A low refractive index layer or a part thereof of the lower DBR 102 adjacent to the active region 106 is substituted by the current confining layer 110. The n-type carrier blocking layer 105 is formed on the active region 106. The n-type cavity extending region 104 is formed on the carrier blocking layer 105. An n-type upper DBR 108 is formed on the cavity extending region 104. The p-side electrode 112 is formed on a bottom portion of the substrate 100. The n-side electrode 114 including a circular emission window 114A is formed on a top portion of the upper DBR 108. To form the mesa M in the third exemplary embodiment, etching is performed to a depth reaching the lower DBR 102 and exposing the current confining layer 110.

Exemplary embodiments of the present invention have been described in detail above. The invention, however, is not limited to specific exemplary embodiments, and may be altered or modified in various ways within the scope of the gist of the invention described in the claims.

In the above-described exemplary embodiments, the lower DBR 102 and the upper DBR 108 are made of AlGaAs. The pair of the high refractive index layer and the low refractive index layer, however, may be made of a semiconductor material other than AlGaAs. For example, in the case of a long oscillation wavelength, the DBRs may be made of GaAs, such as GaAs for the high refractive index layer and AlGaAs for the low refractive index layer.

In the above-described exemplary embodiments, a selective oxidation-type VCSEL having an extended cavity structure has been described as an example. As an alternative to the selective oxidation-type, an insulating region may be formed by proton ion injection. In this case, it is unnecessary to form the mesa M on the substrate 100.

In the above-described exemplary embodiments, the description has been given of an example in which the laser light is emitted from a top portion of the mesa M. The laser light, however, may be emitted from the rear surface of the substrate 100, without forming the mesa M. In this case, the reflectance of the lower DBR 102 is set to be lower than that of the upper DBR 108, and an emission window is formed in the n-side electrode 114 or the p-side electrode 112.

In the above-described exemplary embodiments, the description has been given of an example in which the n-side electrode 114 or the p-side electrode 112 is formed on the rear surface of the substrate 100. The n-side electrode 114 or the p-side electrode 112, however, may be directly connected to the lower DBR 102. In this case, the substrate 100 may be semi-insulating.

Further, a buffer layer may be formed, as necessary, between the GaAs substrate 100 and the lower DBR 102. Further, although a GaAs-based VCSEL has been described as an example in the above-described exemplary embodiments, the invention may also be applied to an extended cavity VCSEL using another III-V group compound semiconductor. Further, although a single-spot VCSEL has been described as an example in the above-described exemplary embodiments, the VCSEL may be a multi-spot VCSEL including a multitude of mesas (light emitting portions) formed on a substrate, or may be a VCSEL array.

With reference to the drawings, description will now be given of a surface emitting semiconductor laser device, an optical information processing apparatus, and an optical transmission device using the VCSEL having an extended cavity structure according to one of the exemplary embodiments. FIG. 7A is a cross-sectional view illustrating the configuration of a surface emitting semiconductor laser device mounted (packaged) with the VCSEL and an optical member. In a surface emitting semiconductor laser device 300, a chip 310 formed with the VCSEL having an extended cavity structure is fixed on a disc-shaped metal stem 330 via a conductive adhesive 320. Conductive leads 340 and 342 are inserted in through-holes (illustration thereof is omitted) formed in the stem 330, with the lead 340 electrically connected to the n-side electrode of the VCSEL and the other lead 342 electrically connected to the p-side electrode of the VCSEL.

A rectangular hollow cap 350 is fixed on the stem 330 including the chip 310, and a ball lens 360 serving as an optical member is fixed in an opening 352 at the center of the cap 350. The optical axis of the ball lens 360 is positioned to substantially match the center of the chip 310. When a voltage in a forward direction is applied between the leads 340 and 342, laser light is emitted in the vertical direction from the chip 310. The distance between the chip 310 and the ball lens 360 is adjusted such that the ball lens 360 is situated within a divergence angle θ of the laser light from the chip 310. Further, a light receiving element or a temperature sensor for monitoring the light emission state of the VCSEL may be included in the cap 350.

FIG. 7B is a diagram illustrating the configuration of another surface emitting semiconductor laser device. In a surface emitting semiconductor laser device 302 illustrated in the drawing, the ball lens 360 is replaced by a flat glass 362 fixed in the opening 352 at the center of the cap 350. The center of the flat glass 362 is positioned to substantially match the center of the chip 310. The distance between the chip 310 and the flat glass 362 is adjusted such that the aperture diameter of the flat glass 362 is equal to or greater than the divergence angle θ of the laser light from the chip 310.

FIG. 8 is a diagram illustrating an example in which the VCSEL is applied to a light source of an optical information processing apparatus. An optical information processing apparatus 370 includes a collimator lens 372, a polygon mirror 374, an fθ lens 376, a linear reflecting mirror 378, and a photoconductor drum (recording medium) 380. The collimator lens 372 receives the laser light incident thereon from the surface emitting semiconductor laser device 300 or 302 mounted with the VCSEL having an extended cavity structure as in FIG. 7A or 7B. The polygon mirror 374 rotates at a constant speed, and reflects a beam of light from the collimator lens 372 at a predetermined divergence angle. The fθ lens 376 receives the laser light incident thereon from the polygon mirror 374, and radiates the laser light onto the reflecting mirror 378. On the photoconductor drum 380, a latent image is formed on the basis of the light reflected by the reflecting mirror 378. The VCSEL may thus be used as a light source of an optical information processing apparatus, such as a copier or a printer, including an optical system that condenses the laser light from the VCSEL onto a photoconductor drum and a mechanism that scans the condensed laser light on the photoconductor drum.

FIG. 9 is a cross-sectional view illustrating the configuration of an optical transmission device applied with the surface emitting semiconductor laser device illustrated in FIG. 7A. An optical transmission device 400 is configured to include a cylindrical housing 410 fixed to the stem 330, a sleeve 420 formed integrally with an end surface of the housing 410, a ferrule 430 held in an opening 422 of the sleeve 420, and an optical fiber 440 held by the ferrule 430. An end portion of the housing 410 is fixed to a flange 332 formed in the circumferential direction of the stem 330. The ferrule 430 is accurately positioned in the opening 422 of the sleeve 420 to match the optical axis of the optical fiber 440 with the optical axis of the ball lens 360. A core of the optical fiber 440 is held in a through-hole 432 of the ferrule 430.

The laser light emitted from a surface of the chip 310 is condensed by the ball lens 360. The condensed light is incident on the core of the optical fiber 440, and is transmitted. Although the above-described example uses the ball lens 360, a lens other than the ball lens 360, such as a biconvex lens or a plano-convex lens, may be used. Further, the optical transmission device 400 may include a drive circuit for applying electrical signals to the leads 340 and 342. Further, the optical transmission device 400 may have a reception function for receiving optical signals via the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface emitting semiconductor laser comprising:
    a substrate;
    a first semiconductor multilayer reflector formed on the substrate, and including laminated pairs of a high refractive index layer having a relatively high refractive index and a low refractive index layer having a relatively low refractive index;
    an active region formed on or above the first semiconductor multilayer reflector;
    a second semiconductor multilayer reflector formed on or above the active region, and including laminated pairs of a high refractive index layer having a relatively high refractive index and a low refractive index layer having a relatively low refractive index; and
    a cavity extending region formed between the first semiconductor multilayer reflector and the active region or between the second semiconductor multilayer reflector and the active region, having an optical film thickness greater than an oscillation wavelength, extending a cavity length, and including a conductive semiconductor material,
    wherein the cavity extending region includes an optical loss causing layer at the position of at least one node of a standing wave of a selected longitudinal mode, and
    wherein the semiconductor material forming the cavity extending region has a composition in which a semiconductor material forming the optical loss causing layer and a semiconductor material forming a layer other than the optical loss causing layer are equal in composition.

2. The surface emitting semiconductor laser according to claim 1, wherein the cavity extending region includes another layer having an impurity concentration that is less than an impurity concentration of the optical loss causing layer.

3. The surface emitting semiconductor laser according to claim 1, wherein the optical loss causing layer is formed at the position of an antinode of a standing wave of a non-selected longitudinal mode in the cavity extending region.

4. The surface emitting semiconductor laser according to claim 1, further comprising:
    a carrier blocking layer formed between the cavity extending region and the active region.

5. The surface emitting semiconductor laser according to claim 1, wherein the optical loss causing layer is one of a plurality of optical loss causing layers formed at regular intervals in the cavity extending region.

6. The surface emitting semiconductor laser according to claim 1, wherein, when λ represents the oscillation wavelength and n represents the refractive index of the optical loss causing layer, the optical loss causing layer has a film thickness of approximately λ/4 n or less.

7. The surface emitting semiconductor laser according to claim 1, wherein the length of a resonator determined by the first semiconductor multilayer reflector, the cavity extending region, the active region, and the second semiconductor multilayer reflector is greater than the oscillation wavelength, and
    wherein the resonator has a reflection band including a plurality of resonance wavelengths, one of which is selected as a longitudinal mode.

8. The surface emitting semiconductor laser according to claim 1, wherein the substrate has a substantially columnar structure formed thereon, and the substantially columnar structure has a current confining layer formed therein near the active region, and
    wherein the current confining layer includes an oxidized region selectively oxidized from a side surface of the substantially columnar structure and a conductive region surrounded by the oxidized region.

9. The surface emitting semiconductor laser according to claim 8, wherein the optical loss causing layer is equal in film thickness to the current confining layer.

10. The surface emitting semiconductor laser according to claim 1, wherein the semiconductor material forming the cavity extending region has a composition in which a semiconductor material forming the optical loss causing layer and a semiconductor material forming a layer other than the optical loss causing layer are different in composition, and
    wherein the composition of the optical loss causing layer includes a semiconductor material that absorbs the oscillation wavelength.

11. A surface emitting semiconductor laser device comprising:
    the surface emitting semiconductor laser according to claim 1; and
    an optical member that receives laser light incident thereon from the surface emitting semiconductor laser.

12. An optical transmission device comprising:
    the surface emitting semiconductor laser device according to claim 11; and
    a transmission unit that transmits, via an optical medium, the laser light emitted from the surface emitting semiconductor laser device.

13. An information processing apparatus comprising:
    the surface emitting semiconductor laser according to claim 1;
    a condensing unit that condenses laser light emitted from the surface emitting semiconductor laser onto a recording medium; and
    a mechanism that scans, on the recording medium, the laser light condensed by the condensing unit.

14. The surface emitting semiconductor laser according to claim 1, wherein the optical loss layer has a thickness that is less than a wavelength of the standing wave of the selected longitudinal mode.

* * * * *